(12) United States Patent
Casagrande

(10) Patent No.: US 6,728,527 B2
(45) Date of Patent: Apr. 27, 2004

(54) DOUBLE UP-CONVERSION MODULATOR

(75) Inventor: Arnaud Casagrande, Lignières (CH)

(73) Assignee: Asulab S.A., Marin (CH)

( * ) Notice: Subject to any disclaimer, the term of this patent is extended or adjusted under 35 U.S.C. 154(b) by 9 days.

(21) Appl. No.: 10/165,972

(22) Filed: Jun. 11, 2002

(65) Prior Publication Data

US 2003/0011861 A1 Jan. 16, 2003

(30) Foreign Application Priority Data

Jul. 10, 2001 (CH) .............................. 1268-01

(51) Int. Cl.[7] .............................................. H04B 15/00
(52) U.S. Cl. ...................................... 455/313; 455/323
(58) Field of Search ............................... 455/313, 314, 455/315, 323; 332/103

(56) References Cited

U.S. PATENT DOCUMENTS

| | | | |
|---|---|---|---|
| 4,816,783 A | * 3/1989 | Leitch | ........................ 332/103 |
| 5,373,265 A | 12/1994 | Davis | |
| 5,412,351 A | * 5/1995 | Nystrom et al. | ............ 332/103 |
| 5,847,623 A | 12/1998 | Hadjichristos | |
| 5,861,781 A | 1/1999 | Ashby | |
| 6,016,422 A | * 1/2000 | Bartusiak | ...................... 455/76 |
| 6,029,059 A | 2/2000 | Bojer | |
| 6,240,142 B1 | * 5/2001 | Kaufman et al. | ........... 375/261 |
| 6,282,413 B1 | * 8/2001 | Baltus | ......................... 455/260 |
| 6,373,883 B1 | * 4/2002 | Soerensen et al. | .......... 375/216 |

FOREIGN PATENT DOCUMENTS

EP            0 998 024 A2       5/2000

* cited by examiner

Primary Examiner—Timothy P. Callahan
Assistant Examiner—Cassandra Cox
(74) Attorney, Agent, or Firm—Sughrue Mion, PLLC

(57) ABSTRACT

A double up-conversion modulator includes a first conversion stage (1) formed of two modulation units (101, 102), receiving at one input quadriphased baseband signals, controlled by four quadriphased carrier signals at a first intermediate frequency (IF1), and delivering at one output opposite up-converted signals (IF1C, IF1C_b) at said first intermediate frequency. The modulator further includes a second up-conversion stage (2) receiving at one input said up-converted signals at said first intermediate frequency, controlled by two other in phase opposition carrier signals at a second intermediate frequency (IF2), and delivering at one output a high frequency signal (HF_M), said high frequency (HF) corresponding to the sum of said first and second intermediate frequencies (IF1+IF2).

4 Claims, 3 Drawing Sheets

DOUBLE UP-CONVERSION MODULATOR

The present invention concerns an in quadrature double frequency up-conversion modulator, used in particular in transmitter circuits for mobile telephones. The double up-conversion modulator includes a first frequency up-conversion stage formed by a first modulation unit. This first modulation unit receives at one input baseband quadriphased signals, formed of a first in-phase signal, a second in phase opposition signal, a third in quadrature signal and a fourth in quadrature-opposition signal. This first unit is controlled by carrier signals quadriphased at a first intermediate frequency formed by a first in-phase carrier signal, a second in phase opposition carrier signal, a third in quadrature carrier signal and a fourth in quadrature-opposition carrier signal. The modulation unit delivers a signal up-converted to the first intermediate frequency at one of its ouptut.

This type of simple up-conversion in quadrature modulator, formed of a single modulation unit, is widely known in the prior art. The modulator, such as that shown in FIG. 1, includes two differential mixers 10 and 12. The first mixer 10 receives at one input an in-phase baseband signal bbI and the second mixer 12 receives at one input an in quadrature baseband signal bbQ. The two mixers 10 and 12 are controlled by high frequency carrier signals HF_I and HF_Q obtained by a high frequency in quadrature signal generator, which is not shown. The first mixer 10 is controlled by an in-phase high frequency carrier signal HF_I. The second mixer 12 is controlled by an in quadrature high frequency carrier signal HF_Q, namely a signal phase shifted by 90° with respect to carrier signal HF_I. The signals delivered at the outputs of mixers 10 and 12 are in quadrature signals modulated at the frequency of the carrier signals. An adder 14 placed at the output of the modulator adds the two modulated signals to provide the high frequency modulated signal HF_M at its output.

The drawback of such a simple up-conversion modulator lies in the necessity of generating high frequency carrier signals HF_I and HF_Q that are perfectly in quadrature. Such a signal generator quickly becomes complex without however being able to assure a phase shift of 90° with sufficient precision. Moreover, the power consumption of such a generator is quite significant.

Another type of simple up-conversion in quadrature modulator known in the prior art is shown in FIG. 2. This modulator operates on exactly the same principle as that presented hereinbefore. The difference from the previous modulator lies in the generation of high frequency in quadrature carrier signals HF_I and HF_Q. Here, a high frequency generator 26 is used to generate carrier signals at a frequency 2HF double the frequency desired for the modulated output signal. An in quadrature frequency divider-by-two 28 is placed at one output of generator 26, which enables carrier signals HF_I and HF_Q to be obtained perfectly in quadrature with the modulation frequency HF desired for controlling differential mixers 20 and 22 of the modulator.

The drawback of this type of modulator lies in the excessive power consumption of high frequency generator 26, used to generate signals at a frequency that is double the desired frequency. Indeed, for frequencies of the order of one GHz, such as for example 900 MHz (mobile telephone range), the generator has to generate signals at a frequency of 1.8 GHz.

One of the permanent concerns of those skilled in the art is making low power consuming circuits, which are generally integrated in portable communication tools, while still obtaining optimum in quadrature signal modulation quality.

The invention is characterised in that it allows the aforementioned drawbacks to be avoided.

The present invention thus concerns a double up-conversion modulator, as defined in the preamble, characterised in that the first stage is also formed of a second modulation unit, similar to the first unit, receiving at one input said first, second, third and fourth baseband signals, controlled by said first, second, third and fourth carrier signals at said first intermediate frequency, and delivering at one output a second converted signal, in phase opposition to said first up-converted signal, at said first intermediate frequency, and in that the modulator further includes a second up-conversion stage, receiving at one input said first and second up-converted signals at said first intermediate frequency, controlled by two other carrier signals at a second intermediate frequency, formed by a fifth in-phase carrier signal and a sixth in phase opposition carrier signal, and delivering at one output a high frequency signal, said high frequency corresponding to the sum of said first and second intermediate frequencies.

The modulator according to the invention thus enables low power consuming modulation to be achieved. Indeed, the carrier signals used to transpose the input baseband signals into a high frequency output signal, are signals at intermediate frequencies lower than the high output modulation frequency. Thus, the lower the frequency, the lower the amount of power consumed by the generator, which is used to provide these carrier signals.

Another constant concern of those skilled in the art is the necessity for generating the cleanest possible modulated signals. In order to do this, it is indispensable to remove all the stray signals or feedthrough signals which appear in unbalanced structures.

This is why, according to an advantageous embodiment of the invention, the double up-conversion modulator is characterised in that the two modulation units of the first up-conversion stage include respectively, first and second differential mixers, and third and fourth differential mixers, in that the first and second mixers provide at their output, respectively, first and second modulated signals at the first intermediate frequency (IF1), the first and second modulated signals being added at the output of the first unit to obtain the first up-converted signal, in that the third and fourth differential mixers provide at their output, respectively, third and fourth signals modulated to the first intermediate frequency, the third and fourth modulated signals being added at the output of the second unit to obtain the second up-converted signal, and in that the second up-conversion stage is formed of a fifth differential mixer.

Finally, in this type of in quadrature modulator, it is very important that the carrier signals are in quadrature and with great precision. Indeed, particularly in a field such as mobile telephony where the modulation frequencies are of the order of one GHz, any phase shift between the in-phase signals and the in quadrature signals leads to the appearance of additional stray signals.

In a preferred embodiment of the invention, the double up-conversion modulator is characterised in that the carrier signals at the second intermediate frequency controlling the second up-conversion stage are directly generated by a signal generator at the second intermediate frequency and in that the carrier signals at the first intermediate frequency controlling the first up-conversion stage are obtained after dividing the frequency by two in an in quadrature frequency divider placed at one output of the signal generator, the second intermediate frequency being twice as high as the first intermediate frequency.

The invention will be explained hereinafter in detail via an embodiment given solely by way of example, this embodiment being illustrated by the annexed drawings, in which.

Figure 1:
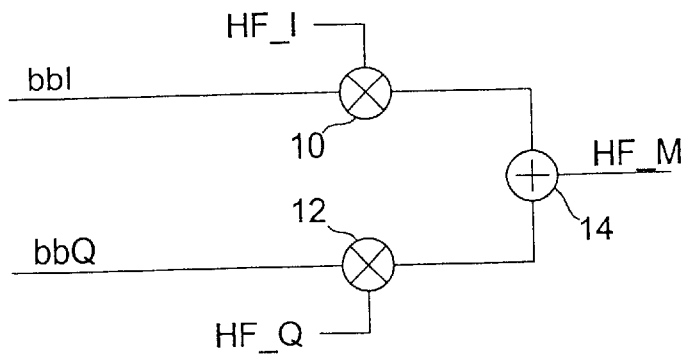
FIG. 1 shows an in quadrature modulator according to the prior art.
Figure 2:
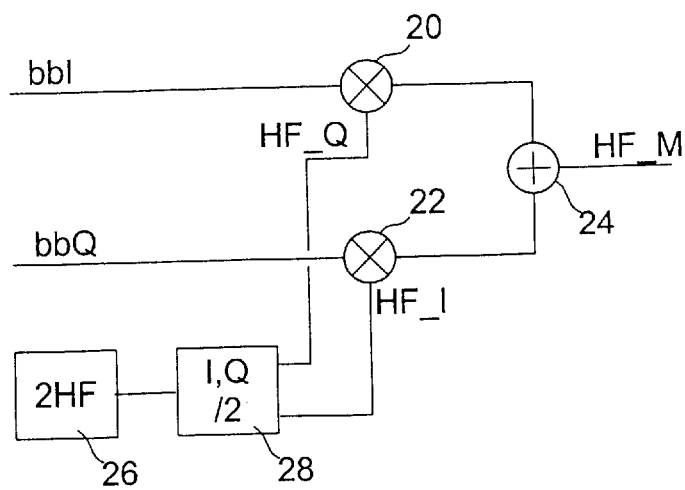
FIG. 2 shows another in quadrature modulator according to the prior art.

FIGS. 1 and 2 have already been described within the scope of the prior art.

Figure 3:
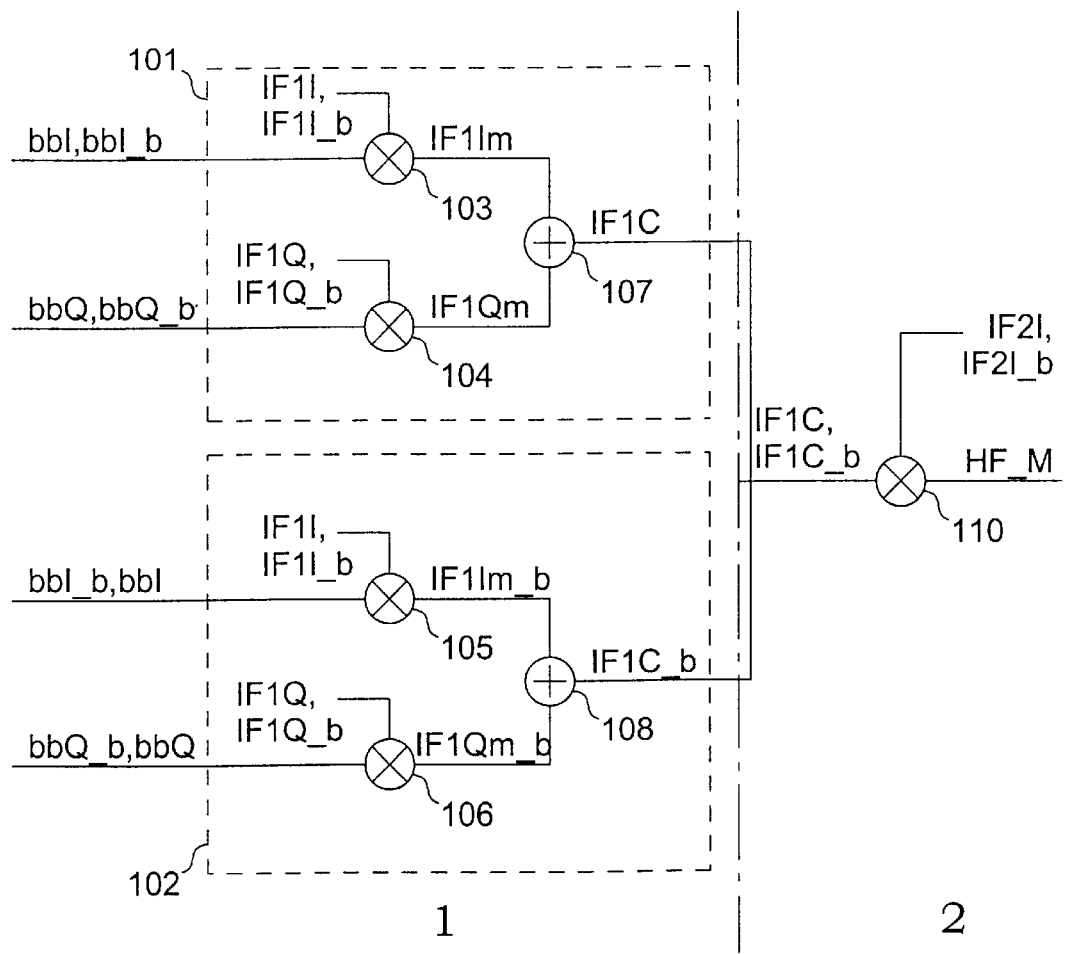
FIG. 3 is a schematic diagram of the modulator according to the invention.

FIG. 3 is a schematic diagram of the double up-conversion modulator according to the invention. The modulator divided into two stages called frequency up-conversion stages. Indeed, the role of each of the two stages is to modulate and transpose the signals received at one input to a higher frequency. More specifically, first stage 1 enables the modulator input signals to be modulated at a first intermediate frequency IF1. The signals obtained are then "up-converted" to a greater, or high frequency HF, through second stage 2.

Stage 1 is formed of two so-called "modulation" units 101 and 102. These two units are similar as regards their internal structure. The difference between the two lies in the input and control signals which they receive.

The first modulation unit 101 is formed of two differential mixers 103 and 104 and adder 107. The second modulation unit 102 is formed of two differential mixers 105 and 106 and adder 108. One will preferably use differential mixers formed by a pair of MOS technology transistors. The advantage of using such mixers lies in the cancelling of stray signals or feedthrough signals at the output of the mixer. These feedthrough signals are actually cancelled if the two input signals and the two control signals received by the mixer are in phase opposition.

Unit 101 receives four low frequency or baseband input signals at four inputs. These signals are quadriphased. Mixer 103 receives at a first input the in-phase signal bbI and at a second input the in phase opposition signal bbI_b, and mixer 104 receives at a third input the in-phase quadrature signal bbQ and at a fourth input the in-phase quadrature opposition signal bbQ_b.

Unit 101 also receives four control signals or carrier signals which are also quadriphased. These carrier signals enable the baseband signals (bbI, bbI_b, bbQ and bbQ_b) to be modulated at the carrier signal frequency. Mixer 103 receives the in-phase carrier signal IF1I and the in-phase opposition carrier signal IF1I_b. Mixer 104 receives the in-phase-quadrature carrier signal IF1Q and the in-phase-quadrature opposition carrier signal IF1Q_b. All the carrier signals are at intermediate frequency IF1.

At the output of unit 101, there is placed an adder 107 enabling the two modulated signals IF1Im and IF1Qm, delivered at the outputs of mixers 103 and 104, to be added. These two modulated signals IF1Im and IF1Qm are at intermediate frequency IF1, thus the up-converted signal IF1C at the output of adder 107, and thus at the output of unit 101, is at intermediate frequency IF1. This signal IF1C has the advantage of not having feedthrough signals relating in particular to the stray capacitances and quantities linked to the transistors used in differential mixers.

Unit 102 is formed, in an entirely similar way to unit 101, of two differential mixers 105 and 106 and an adder 108. The signals received at the four inputs are the same four quadriphased baseband signals, and the control carrier signals are the same four signals that are also quadriphased at intermediate frequency IF1.

The difference between the two units 101 and 102 lies in the combination of signals received at their input with the control signals. Indeed, the purpose of this unit 102 is to provide at its one output another up-converted signal IF1C_b in phase opposition with respect to the up-converted signal provided at the output of unit 101.

In order to do this, one need only invert the baseband signals or invert the carrier signals received by each of the mixers, which is the same thing, since the mixers are symmetrical. This inversion will cause a modification in the modulated signals obtained at the output of the mixers. Modulated signal IF1Im-b at the output of mixer 105 is in phase opposition with respect to signal IF1Im. Likewise, the modulated signal IF1Qm_b at the mixer 106 output is in phase opposition with respect to signal IF1Qm. Thus, the up-converted signal IF1C_b obtained at the output of adder 108 is in phase opposition with respect to up-converted signal IF1C.

At the output of up-conversion stage 1, there are thus two up-converted in opposition signals IF1C and IF1C_b at intermediate frequency IF1. These two up-converted signals are provided to up-conversion stage 2.

It should be noted in this embodiment example that the signals up-converted in phase opposition to each are obtained by similar units 101 and 102, but it is however, possible to envisage using other means than mirror unit 102 to obtain the up-converted in phase-opposition signal IF1C_b, like for example a 180° phase shifter.

Stage 2 is formed of a single differential mixer 110 receiving at one input the up-converted signal IF1C and at another input the up-converted signal IF1C_b at intermediate frequency IF1. Mixer 110 is controlled by two carrier signals in phase opposition IF2I and IF2I_b, at intermediate frequency IF2. The modulated signal HF_M obtained at the output of mixer 110 corresponds to the signals received at its inputs but frequency transposed or up-converted. Indeed, modulated signal HF_M is a high frequency signal, whose frequency HF is equal to the sum of intermediate frequencies IF1+IF2.

The use of a differential mixer for the frequency transposition or up-conversion not only eliminates the feedthrough signals, due to stray capacitances of the transistors forming mixer 110, but also eliminates the signals at intermediate stray frequencies IF1 and IF2.

Figure 4:
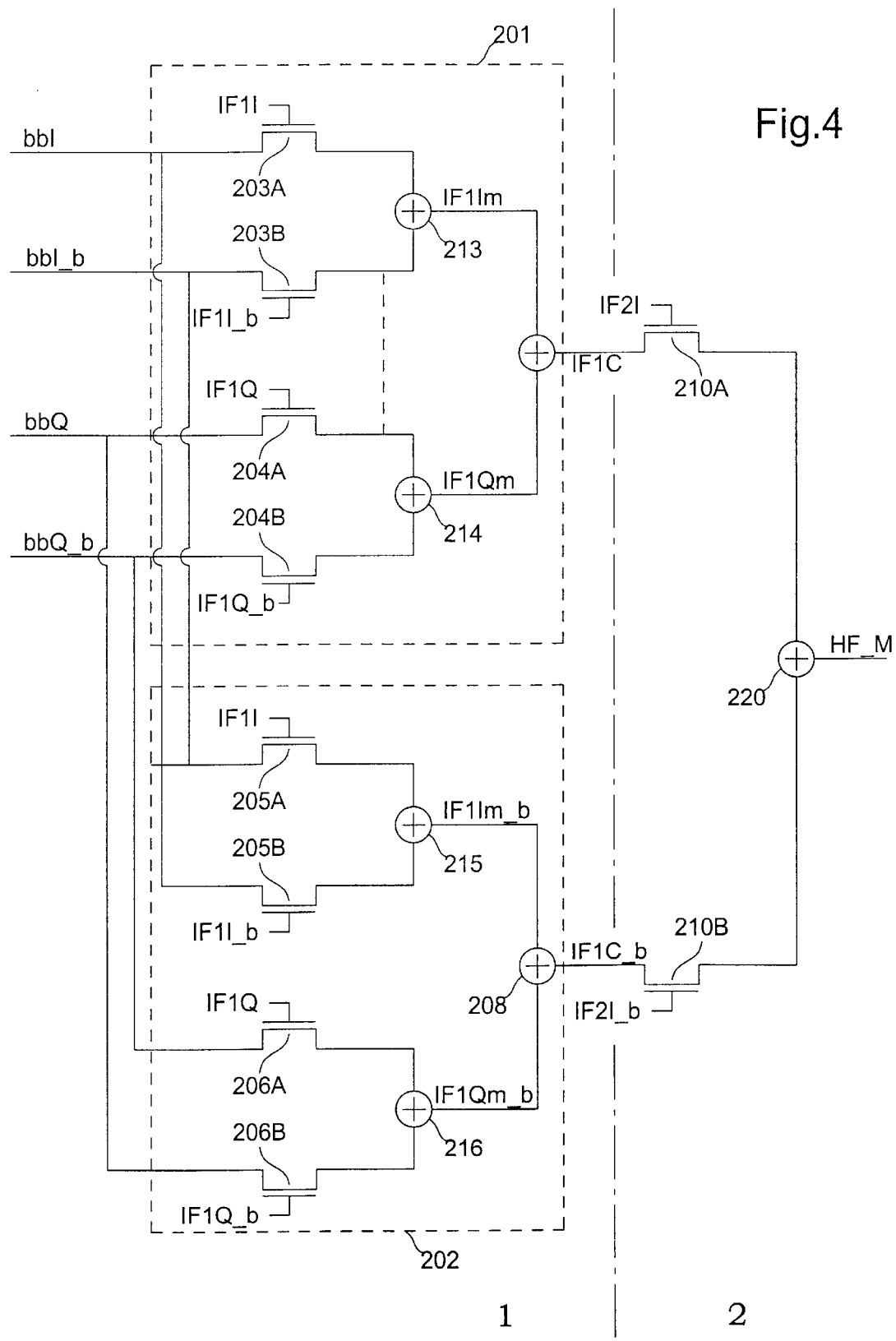
FIG. 4 is a detailed diagram of the modulator according to the invention.

FIG. 4 shows a double up-conversion modulator according to the invention in detail. The global structure of the modulator has already been described with reference to FIG. 3. Thus, the two up-conversion stages 1 and 2 and the two modulation units 201 and 202 of stage 1 can be seen again.

The differential mixers used are each formed of two transistors. The transistors used are preferably MOS technology transistors, which enables a high level of linearity to be obtained for the mixer and thus for the global structure.

Transistors 203A to 206A and 203B to 206B of FIG. 4 correspond to mixers 103 to 106 of FIG. 3, and transistors 210A and 210B of FIG. 4 correspond to mixer 110 of FIG. 3.

In order to be able to obtain up-converted signals IF1C and IF1C_b at the output of units 201 and 202, the baseband signals and the carrier signals provided to these two units are combined as follows:

- transistors 203A and 203B receive at their drain, respectively, the in-phase baseband signal bbI and the in phase opposition baseband signal bbI_b, and at their gate, respectively, the in-phase carrier signal IF1I and the in phase opposition carrier signal IF1I_b, their source being connected 213 to the modulated signal IF1Im;
- transistors 204A and 204B receive at their drain, respectively the in quadrature baseband signal bbQ and the in quadrature opposition baseband signal bbQ_b, and at their gate, respectively, the in quadrature carrier signal IF1Q and the in quadrature opposition carrier signal IF1Q_b, their source being connected 214 to modulated signal IF1Qm;
- transistors 205A and 205B receive at their drain, in reverse with respect to transistors 203A and 203B, respectively, the in phase opposition baseband signal bbI_b and the in-phase baseband signal bbI, and at their gate, respectively, the in-phase carrier signal IF1I and the in phase opposition carrier signal IF1I_b, their source being connected 215 to modulated signal IF1Im_b;
- transistors 206A and 206B receive at their drain, in reverse with respect to transistors 204A and 204B, respectively, the in quadrature opposition baseband signal bbQ_b and the in quadrature baseband signal bbQ, and at their gate, respectively, the in quadrature carrier signal IF1Q and the in quadrature opposition carrier signal IF1Q_b, their source being connected 216 to modulated signal IF1Qm_b;
- adder 207 adds the modulated signals IF1Im and IF1Qm to give the up-converted signal IF1C and adder 208 adds the modulated signals IF1Im_b and IF1Qm_b to give the up-converted signal IF1C_b.

The two up-converted signals are supplied to the input of stage 2. Mixer 110 of FIG. 3 corresponds to transistors 210A and 210B of FIG. 4. In order to keep only the signal modulated at the desired frequency at the output of stage 2, the transistors are controlled by in-phase and in phase opposition carrier signals at intermediate frequency IF2.

Transistor 210A receives at its drain the in-phase up-converted signal IF1C, and at its gate the in-phase carrier signal IF2I. Transistor 210B receives at its drain the in phase opposition up-converted signal IF1C_b and at its gate the in-opposition carrier signal IF2I_b. The sources of transistors 210A and 210B are connected 220 to the high frequency modulated signal HF_M, the frequency HF of this signal being equal to the sum of intermediate frequency IF1 of the up-converted signals and intermediate frequency IF2 of the carrier signals of stage 2.

Figure 5:
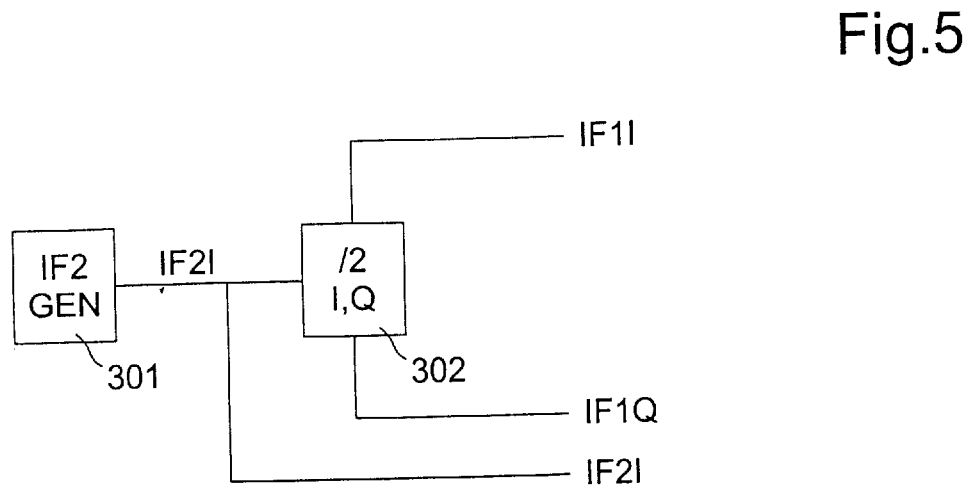
FIG. 5 is a diagram of the carrier signal generator circuit.

FIG. 5 is an example of the means used to generate the carrier signals at intermediate frequencies IF1 and IF2. A generator 301 generating signals at intermediate frequency IF2 supplies at output an in-phase signal IF2I, which is directly supplied to stage 2 of the modulator, means being provided to phase shift the in-phase signal by 180° and thus obtain in-phase signal IF2I and in phase opposition signal IF2I_b. Signal IF2I delivered by generator 301 is also supplied to an in quadrature frequency divider 302. This divider supplies at one output in-phase signal IF1I and at another output in quadrature signal IF1Q at an intermediate frequency IF1 that is two times lower than intermediate frequency IF2. These signals IF1I and IF1Q are supplied to stage 1 of the modulator as carrier signals, where means are also provided for generating the in phase opposition signals.

In the example of mobile telephony, the modulation frequency is 900 MHz. It will thus be advantageous to take a generator generating signals at 600 MHz and a frequency divider-by-two. Intermediate frequency IF2 will thus be 600 MHz, intermediate frequency IF1 will be two times smaller i.e. 300 MHz. This gives a high modulated signal HF at output of 900 MHz.

It is clear that the description is given only by way of example and that other embodiments, in particular in the means for generating opposite signals such as the mirror modulation unit (102, 202) are comprised within the scope of the present invention.

What is claimed is:

1. A double up-conversion modulator, including a first up-conversion stage, formed of a first modulation unit,
   receiving respectively at first, second, third and fourth inputs quadriphased baseband signals formed by a first in-phase signal, a second in-phase opposition signal, a third in quadrature signal and a fourth in quadrature opposition signal,
   controlled by four quadriphased carrier signals at a first intermediate frequency formed by a first in-phase carrier signal, a second in-phase opposition carrier signal, a third in quadrature carrier signal and a fourth in quadrature opposition carrier signal, and
   delivering at one output a first up-converted signal at said first intermediate frequency,
   characterised in that said first stage is further formed of a second modulation unit similar to said first unit;
   receiving respectively at first, second, third and fourth inputs said first, second, third and fourth baseband signals,
   controlled by said first, second, third and fourth carrier signals at said first intermediate frequency, and
   delivering at one output a second up-converted signal, in phase opposition with respect to said first up-converted signal, at said first intermediate frequency, and in that the modulator further includes a second up-conversion stage,
   receiving respectively at a first and a second inputs said first and second up-converted signals, at said first intermediate frequency,
   controlled by two other carrier signals at a second intermediate frequency, formed by a fifth in-phase carrier signal and a sixth in phase opposition carrier signal, and
   delivering at one output a high frequency signal, said high frequency corresponding to the sum of said first and second intermediate frequencies.

2. The double up-conversion modulation according to claim 1, wherein said first and second modulation units of said first up-conversion stage include respectively, first and second differential mixers, and third and fourth differential mixers,
   in that said first and second mixers provide at one output, respectively, first and second modulated signals at said first intermediate frequency, said first and second modulated signals being added at the output of said first unit to obtain said first up-converted signal,
   in that said third and fourth differential mixers provide at one output, respectively, third and fourth modulated signals at said first intermediate frequency, said third and fourth modulated signals being added at one output of said second unit to obtain said second up-converted signal, and
   in that said second up-conversion stage is formed of a fifth differential mixer.

3. A double up-conversion modulator according to claim 1, wherein said fifth and sixth carrier signals at the second intermediate frequency are directly generated by a signal generator at said second intermediate frequency and in that said first, second, third and fourth carrier signals at the first intermediate frequency are obtained after dividing the frequency by two in an in quadrature frequency divider placed at one output of said signal generator, said second intermediate frequency being twice as high as said first intermediate frequency.

4. A double up-conversion modulator according to claim 2, wherein said fifth and sixth carrier signals at the second intermediate frequency are directly generated by a signal generator at said second intermediate frequency and in that said first, second, third and fourth carrier signals at the first intermediate frequency are obtained after dividing the frequency by two in an in quadrature frequency divider placed at one output of said signal generator, said second intermediate frequency being twice as high as said first intermediate frequency.

* * * * *